(12) United States Patent
Kaneda

(10) Patent No.: US 7,211,735 B2
(45) Date of Patent: May 1, 2007

(54) PROCESSES FOR MANUFACTURING MULTILAYER FLEXIBLE WIRING BOARDS

(75) Inventor: Yutaka Kaneda, Kanuma (JP)

(73) Assignees: Sony Corporation, Tokyo (JP), part interest; Sony Chemical & Information Device Corporation, Tokyo (JP), part interest ( * ) Notice: Subject to any disclaimer, the term of this patent is extended or adjusted under 35 U.S.C. 154(b) by 105 days.

(21) Appl. No.: 10/028,624

(22) Filed: Dec. 20, 2001

(65) Prior Publication Data

US 2002/0079134 A1    Jun. 27, 2002

(30) Foreign Application Priority Data

Dec. 21, 2000    (JP) .............................. 2000-388816

(51) Int. Cl.
*H05K 1/00* (2006.01)
(52) U.S. Cl. ..................... 174/254; 428/209; 428/901
(58) Field of Classification Search ................ 174/250, 174/254, 255, 268; 361/746–751; 29/846; 428/209, 901
See application file for complete search history.

(56) References Cited

U.S. PATENT DOCUMENTS

| 2,014,524 | A | * | 9/1935 | Franz .......................... 336/200 |
| 2,911,605 | A | * | 11/1959 | Wales, Jr. ................... 336/200 |
| 3,409,732 | A | * | 11/1968 | Dahlgren et al. ........... 174/254 |
| 3,780,431 | A | * | 12/1973 | Feeney ......................... 29/830 |
| 4,681,656 | A | * | 7/1987 | Byrum ......................... 216/65 |
| 5,062,916 | A | * | 11/1991 | Aufderheide et al. ....... 156/269 |
| 6,195,881 | B1 | * | 3/2001 | Giardina et al. ............. 29/846 |
| 6,200,824 | B1 | * | 3/2001 | Hashimoto ................... 438/15 |
| 6,320,135 | B1 | * | 11/2001 | Saito .......................... 174/250 |

FOREIGN PATENT DOCUMENTS

JP    02-239695    9/1990

OTHER PUBLICATIONS

Office Action of Chinese Patent Application No. 01145469.5 dated Aug. 20, 2004 (4 pages).
English translation of Chinese Office Action dated Aug. 20, 2004 for Chinese Patent Application No. 01145469.5 (3 pages).
English Abstract of Japanese Publication No. 02-239695 dated Sep. 2, 1990 (1 page).

* cited by examiner

*Primary Examiner*—Dean A. Reichard
*Assistant Examiner*—Jeremy C. Norris
(74) *Attorney, Agent, or Firm*—Osha Liang LLP

(57) ABSTRACT

A process for manufacturing a multilayer flexible wiring board, which allows individual layers of wiring boards to be precisely positioned and to be readily stacked. A mask for exposure is prepared in which a plurality of pattern holes corresponding to individual layers of wiring boards of a multilayer flexible wiring board are arranged in the direction perpendicular to the transporting direction P of substrate. This mask for exposure is used to form a plurality of wiring patterns corresponding to individual layers of wiring boards of a multilayer flexible wiring board on the same sheet-like substrate.

3 Claims, 4 Drawing Sheets

PROCESSES FOR MANUFACTURING MULTILAYER FLEXIBLE WIRING BOARDS

FIELD OF THE INVENTION

The present invention relates to processes for manufacturing flexible wiring boards made of a polyimide for example. More particularly, the invention relates to a technique of stacking a plurality of layers of flexible wiring boards.

BACKGROUND OF THE INVENTION

Flexible printed wiring boards comprising a circuit formed of a layer of a conductor such as a copper foil stacked on a flexible insulating film are known in the art.

With recent trends toward smaller electronic components, such flexible wiring boards involve connecting electrodes with finer pitches and an advanced multilayer structure.

This type of multilayer flexible wiring boards have typically been prepared by positioning each layer of wiring board to form a wiring pattern and bonding these layers into a multilayer structure.

With the prior art as described above, dimensional changes may vary between layers of wiring boards due to heat shrinkage during manufacturing processes or other factors, which means difficulty in stacking the wiring boards to electrically connect them.

Further, it is difficult to control dimensional changes in each layer of wiring board by this technique.

A film-like mask for exposure is sometimes used to form a circuit pattern in each layer of wiring board, which may add the influence of the shrinkage of the mask for exposure itself.

What is needed, therefore, is a process for manufacturing a multilayer flexible wiring board, which allows individual layers of wiring boards to be precisely positioned and to be readily stacked.

SUMMARY OF THE INVENTION

In one aspect, the present invention relates to a stock sheet for a flexible wiring board comprising a flexible sheet-like substrate, and a plurality of wiring patterns arranged in a predetermined direction on the substrate and corresponding to patterns on individual layers of wiring boards of a multilayer flexible wiring board.

In another aspect, the present invention relates to a stock sheet wherein each wiring pattern is arranged in a direction perpendicular to a transporting direction of the substrate.

In another aspect, the present invention relates to a mask for exposure used in a photoetching process, comprising a sheet-like mask body, and a plurality of pattern holes arranged in a predetermined direction in the mask body and corresponding to individual layers of wiring boards of a multilayer flexible wiring board.

In another aspect, the present invention relates to a stock sheet wherein each pattern hole is arranged in a direction perpendicular to a transporting direction of the mask body.

In another aspect, the present invention relates to a stock sheet wherein each of the pattern holes corresponds to a wiring pattern.

In another aspect, the present invention relates to a process for manufacturing a multilayer flexible wiring board comprising the step of using a mask for exposure in which a plurality of pattern holes corresponding to individual layers of wiring boards of a multilayer flexible wiring board are arranged in a predetermined direction in a sheet-like mask body and exposing the mask body to light while it is transported in a predetermined direction.

In another aspect, the present invention relates to a stock sheet wherein each pattern hole is arranged in a direction perpendicular to a transporting direction of the mask body.

DETAILED DESCRIPTION

One embodiment of a flexible wiring board in accordance with the present invention will now be described in detail with reference to the drawings.

Figure 1A:
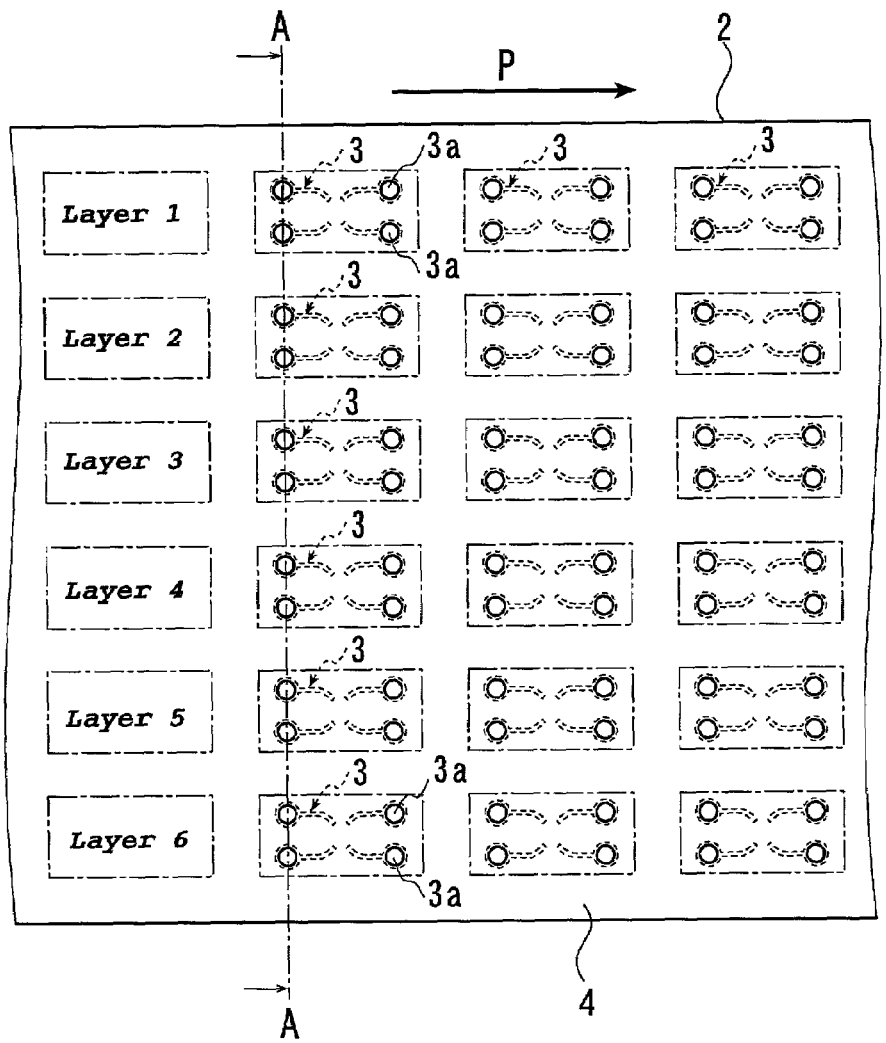
FIG. 1(a) shows a schematic structure of a stock sheet for a flexible wiring board according to an embodiment of the present invention and FIG. 1(b) shows a sectional view along A—A line in FIG. 1(a).
Figure 1B:
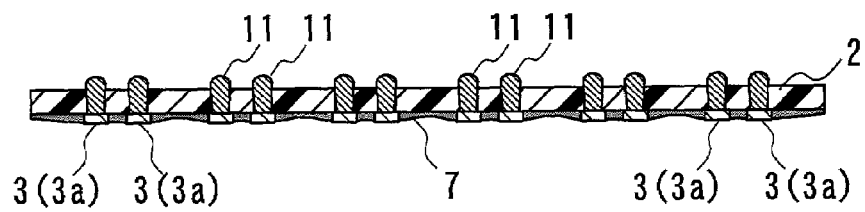

FIG. 1(a) shows a schematic structure of a stock sheet for a flexible wiring board according to the present embodiment and FIG. 1(b) shows a sectional view along A—A line in FIG. 1(a).

As shown in FIG. 1(a), a stock sheet for a flexible wiring board 1 according to the present embodiment is transported in the direction shown by an arrow and taken up by a roll (not shown), and comprises a long film-like substrate 2 on which a plurality of identical wiring patterns 3 corresponding to a plurality of layers (6 layers in this embodiment) of a multilayer flexible wiring board (not shown) are arranged in the direction (width direction) perpendicular to the transporting direction P of substrate 2.

In the present embodiment, wiring patterns 3 are formed on one side of substrate 2 and overlaid with a cover film 7 except for lands 3a of wiring patterns 3 as shown in FIG. 1(b).

In the present embodiment, a predetermined plural number of wiring patterns 3 corresponding to individual layers of wiring boards are arranged at predetermined intervals in the transporting (longitudinal) direction of substrate 2.

On the other side of substrate 2, bumps 11 are disposed and connected to lands 3a of wiring patterns 3.

FIG. 2(a)–(g) and FIG. 3(a)–(g) are flow charts showing an example of a process for manufacturing a flexible wiring board according to the present invention.

Figure 2A:
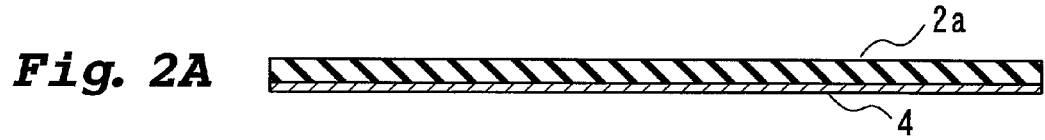
FIG. 2(a)–(g) is a flow chart showing an example of a process for manufacturing a flexible wiring board according to one embodiment of the present invention (part 1).
Figure 2B:
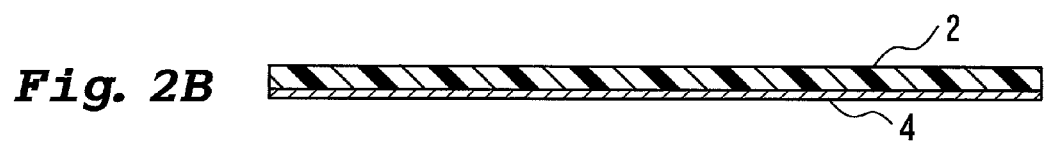
Figure 2C:
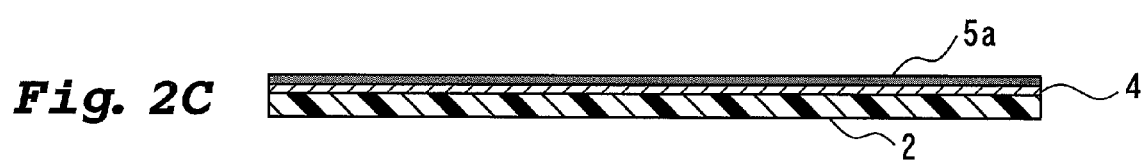

As shown in FIG. 2(a), a polyamic acid 2a is initially applied, in this particular embodiment as a polyamic/solvent solution, in a predetermined thickness, which may be from about 100 µm to about 500 µm in thickness, on a cupper (Cu) foil 4, for example, and heated at a predetermined temperature to give a substrate 2 made of a polyimide as shown in FIG. 2(b). If imidized at a high temperature, a polyimid layer of approximately 8 µ to 40 µm will be formed. In a dry condition, in this embodiment, the layer ranges from about 10 µ to 50 µin thickness.

Then, a photosensitive resist film (for example, dry film resist SPG152 made by Asahi Chemical Industry Co., Ltd.) 5a is applied on the surface of copper foil 4 as shown in FIG.

Figure 2D:
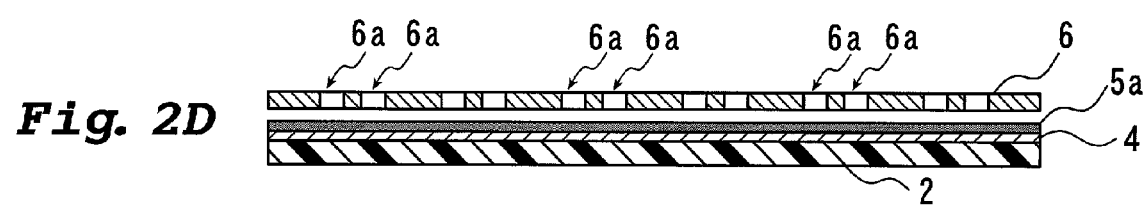
Figure 4A:
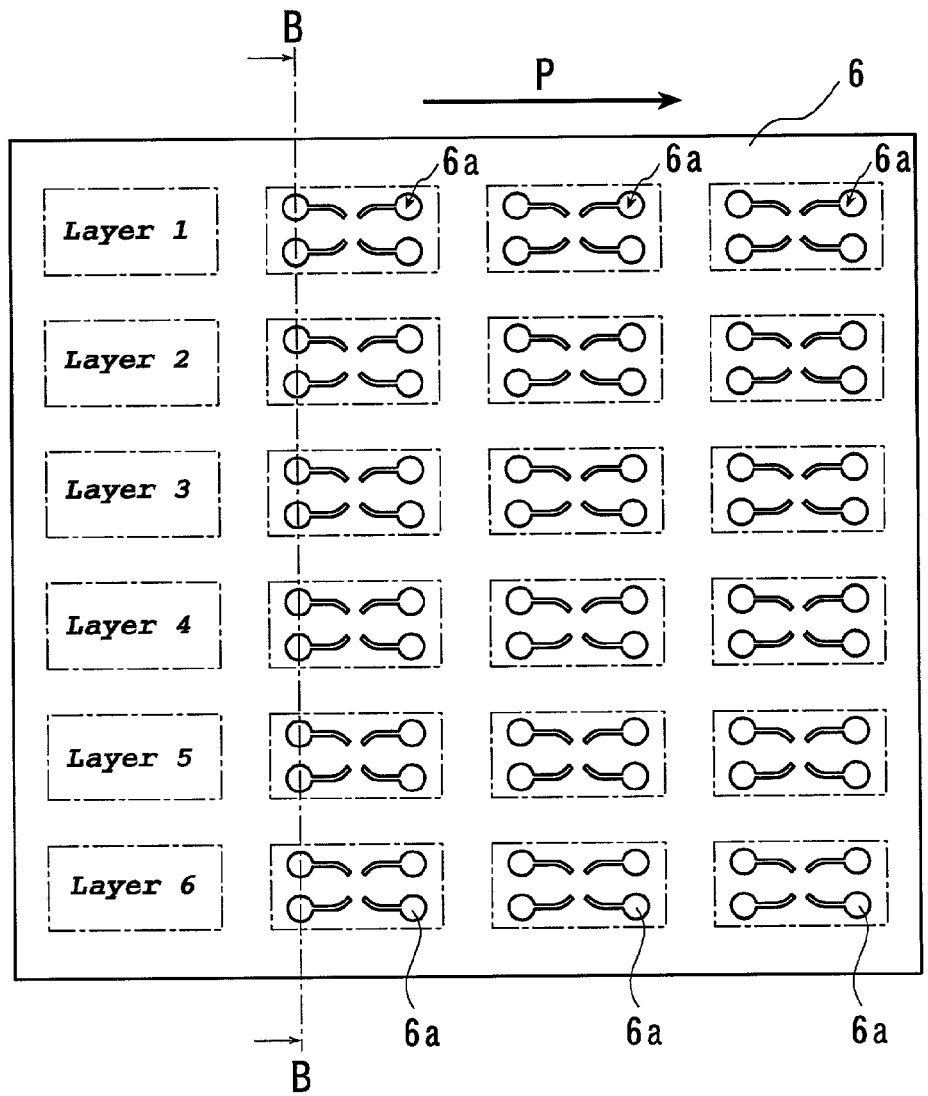
FIG. 4(a) shows an example of a mask for exposure used in one embodiment of in the present invention.

2(c) and the assembly is exposed to light as shown in FIG. 2(d) through a mask for exposure 6 shown in FIGS. 4(a) and (b).

Figure 4B:
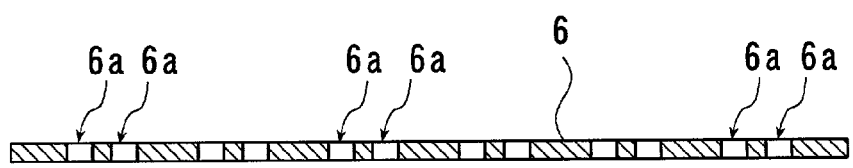
FIG. 4(b) shows a sectional view along B—B line in FIG. 4(a).

Here, FIG. 4(a) shows an example of a mask for exposure used in the present invention, and FIG. 4(b) shows a sectional view along B—B line in FIG. 4(a).

As shown in FIGS. 4(a) and (b), the mask for exposure 6 according to the present embodiment comprises a film-like negative mask in which pattern holes 6a corresponding to wiring patterns 3 on individual layers of a multilayer flexible wiring board are arranged in the direction perpendicular to the transporting direction P of substrate 2.

In the present embodiment, a predetermined number of such pattern holes 6a are arranged at predetermined intervals in the transporting direction P of substrate 2.

Figure 2E:
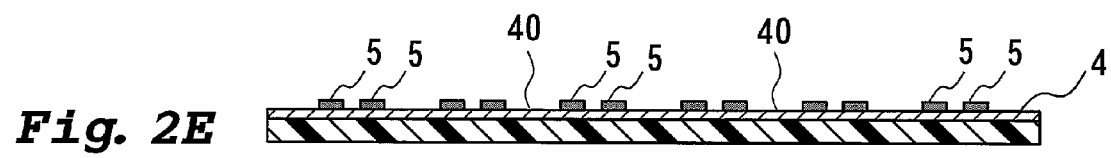
Figure 2F:
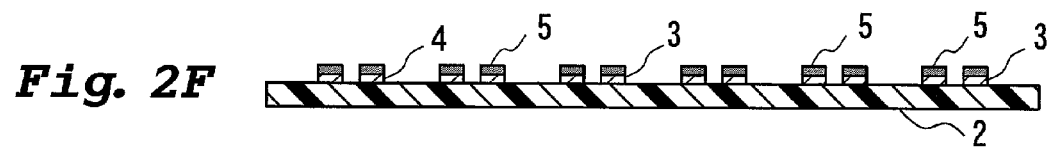

A latent image is formed on resist film 5a by exposure through such a mask 6 for exposure and developed with a suitable developing solution (for example, sodium carbonate) to form resist patterns 5 as shown in FIG. 2(e).

Then, a suitable etching solution (for example, cupric chloride) is used for etching to remove exposed parts 40 of copper foil 4 as shown in FIGS. 2(e) and (f).

Figure 2G:
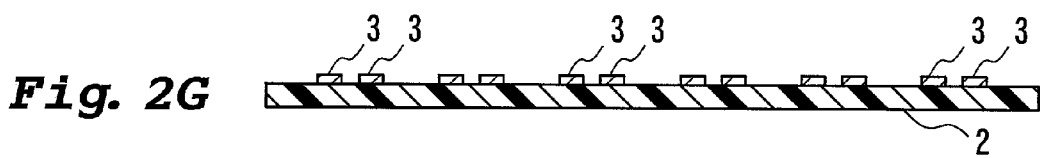

Then, a suitable solution (for example, sodium hydroxide) is used for stripping to remove resist patterns 5 as shown in FIG. 2(g). Thus, desired wiring patterns 3 are formed on substrate 2.

Figure 3A:
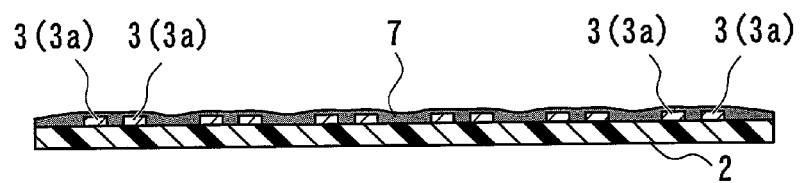
FIG. 3(a)–(g) is a flow chart showing an example of a process for manufacturing a flexible wiring board according to one embodiment of the present invention (part 2).

Then, a cover film 7 made of the same material as that of resist film 5a is applied on substrate 2 and wiring patterns 3 as shown in FIG. 3(a).

Figure 3B:
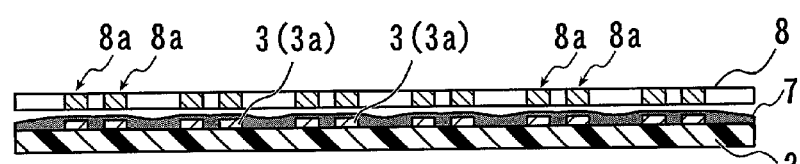
Figure 3C:
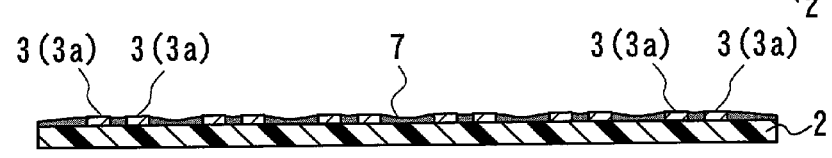

Then, cover film 7 is exposed and developed as desired with a mask for exposure 8 having light screens 8a corresponding to lands 3a of wiring patterns 3 as shown in FIG. 3(b) to expose lands 3a of wiring patterns 3 as shown in FIG. 3 (c).

Figure 3D:
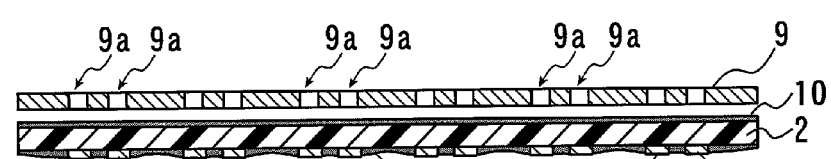

Then, a photosensitive resist film 10 is applied on the reverse side of substrate 2 as shown in FIG. 3(d) and exposed to light through a film-like mask for exposure 9 having negative pattern holes 9a corresponding to lands 3a.

Figure 3E:
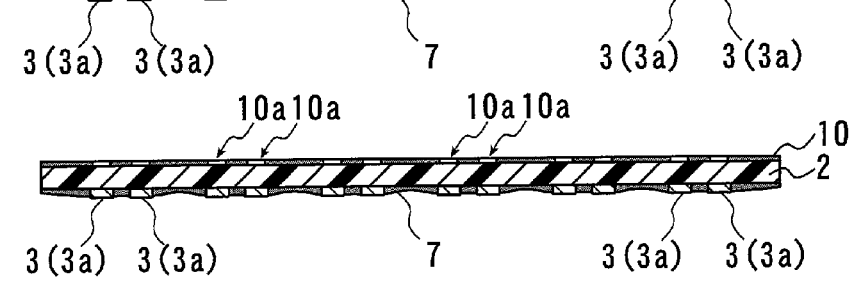

Then, a suitable developing solution (for example, sodium carbonate) is used for development to form holes 10a in resist film 10 as shown in FIG. 3(e).

Figure 3F:
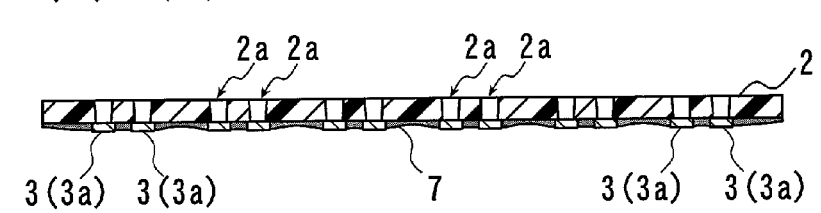

A suitable alkaline etching solution (for example, TMAH (tetramethylammonium hydroxide)) is used for etching to form via holes 2a in substrate 2 as shown in FIG. 3(f).

Figure 3G:
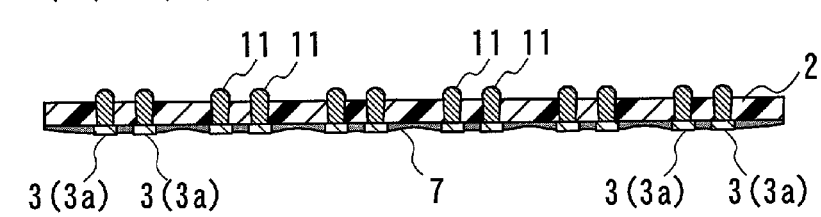

Then, electroplating is performed to fill a solder into each via hole 2a in substrate 2 and form bumps for connection 11 as shown in FIG. 3(g).

Other suitable developing/etching/stripping solutions are known in the art and no limitation on the present invention is intended by reference to specific solutions.

According to the present embodiment, the thickness of substrate 2 or the like scarcely varies between individual layers of wiring boards and dimensional changes in individual layers during manufacturing processes can be homogenized because a plurality of wiring patterns 3 corresponding to individual layers of wiring boards of a multilayer flexible wiring board are arranged on the same substrate 2 as described above.

As a result, the present embodiment allows connecting electrodes on individual layers of wiring boards to be precisely positioned and therefore individual layers of wiring boards to be readily stacked.

According to the present embodiment, the variation in the thickness of substrate 2 or the like with different product lots can be limited because wiring patterns 3 are arranged in the direction perpendicular to the transporting direction P of substrate 2.

Also according to the present embodiment, the structure of the apparatus for manufacturing a multilayer flexible wiring board can be simplified because patterns of wirings on individual layers of wiring boards can be formed with a single mask for exposure 6.

Thus, the present embodiment allows each layer of readily stackable wiring board for a multilayer flexible wiring board to be efficiently prepared.

The present invention is not limited to the foregoing embodiment, but may be modified in various aspects.

For example, the present invention is not limited to the foregoing embodiment in which identical wiring patterns are arranged and formed on a substrate, but different wiring patterns may be arranged layer by layer.

Although the foregoing embodiment relates to a multilayer flexible wiring board consisting of 6 layers of wiring boards, the present invention is not limited to such an embodiment but may also be applied to various multilayer flexible wiring boards comprising 2 or more layers.

The present invention can be applied not only to fully stack wiring boards but also partially stack them.

As described above, the present invention allows individual layers of wiring boards to be precisely positioned and to be readily stacked.

Also according to the present invention, the structure of the apparatus for manufacturing a multilayer flexible wiring board can be simplified because patterns of wirings on individual layers of wiring boards can be formed with a single mask for exposure.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A stock sheet for a multilayer flexible wiring board comprising:
    a long flexible sheet-like substrate; and
    a plurality of wiring patterns formed on a same surface of the substrate, each wiring pattern having connecting electrodes through the substrate and exposed on both sides of the substrate,
    wherein a plurality of wiring patterns corresponding to individual layers of a multilayer flexible wiring board are directly arranged on the same surface of the substrate in the width direction, which is perpendicular to the longitudinal direction of the substrate, and a plurality of the directly arranged wiring patterns corresponding to multilayer flexible wiring boards are arranged in the longitudinal direction of the substrate.

2. The stock sheet of claim 1, wherein the wiring patterns corresponding to individual layers of a multilayer flexible wiring board are arranged in a direction perpendicular to the longitudinal direction in which the substrate is transported.

3. The stock sheet of claim 1, wherein the connecting electrodes comprise lands and bumps, wherein the lands are formed with the wiring patterns on one side of the substrate, the bumps are formed on the other side of the substrate and connected to the lands through the substrate, and the lands and the bumps are directly arranged in the width direction of the substrate in the group of wiring patterns corresponding to individual layers of a multilayer flexible wiring board.

* * * * *